United States Patent
Kim et al.

(10) Patent No.: US 8,237,215 B2
(45) Date of Patent: Aug. 7, 2012

(54) SILICON ON INSULATOR DEVICE AND METHOD FOR FABRICATING THE SAME

(75) Inventors: Yong Taik Kim, Seoul (KR); Tae Su Jang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 596 days.

(21) Appl. No.: 12/346,959

(22) Filed: Dec. 31, 2008

(65) Prior Publication Data

US 2009/0184363 A1    Jul. 23, 2009

(30) Foreign Application Priority Data

Jan. 18, 2008    (KR) .................. 10-2008-0005901

(51) Int. Cl.
*H01L 29/78*    (2006.01)
(52) U.S. Cl. .................. 257/324; 257/347; 438/479
(58) Field of Classification Search .................. 257/324, 257/E29.255, E21.158, E21.24, 350, 351, 257/333, 334, 524, E21.563, E21.567–E21.57, 257/347; 438/149–166, 423, 586, 591, 479
See application file for complete search history.

(56) References Cited

U.S. PATENT DOCUMENTS

| | | | | |
|---|---|---|---|---|
| 5,528,063 A | * | 6/1996 | Blanchard | 257/335 |
| 6,300,182 B1 | * | 10/2001 | Yu | 438/217 |
| 2003/0094654 A1 | * | 5/2003 | Christensen et al. | 257/347 |
| 2004/0175899 A1 | * | 9/2004 | Lu et al. | 438/407 |
| 2005/0085027 A1 | * | 4/2005 | Mimura et al. | 438/197 |

FOREIGN PATENT DOCUMENTS

| | | | |
|---|---|---|---|
| JP | 2004-306367 | * | 10/2004 |
| JP | 2006-120814 A | | 5/2006 |
| KR | 1020040009383 A | | 1/2004 |

* cited by examiner

*Primary Examiner* — Marcos D. Pizarro
*Assistant Examiner* — Suian Tang
(74) *Attorney, Agent, or Firm* — Ladas & Parry LLP

(57) ABSTRACT

An SOI device includes an SOI substrate having a structure in which a first buried oxide layer and a silicon layer are stacked in turn over a semiconductor substrate. A gate is formed over the silicon layer of the SOI substrate. A second buried oxide layer is formed at both sides of the gate in a lower portion of the silicon layer so that a lower end portion of the second buried oxide layer is in contact with the first buried oxide layer. A junction region is then formed in the portion of the silicon layer above the second buried oxide layer so that the lower end portion of the junction region is in contact with the second buried oxide layer.

18 Claims, 6 Drawing Sheets

SILICON ON INSULATOR DEVICE AND METHOD FOR FABRICATING THE SAME

CROSS-REFERENCE TO RELATED APPLICATIONS

The present application claims priority to Korean patent application number 10-2008-0005901 filed on Jan. 18, 2008, which is incorporated herein by reference in its entirety.

BACKGROUND OF THE INVENTION

The present invention relates generally to a Silicon On Insulator (SOI) device and a method for fabricating the same, and more particularly, to a SOI device that can obtain a floating body effect as well as prevent punch-through and a method for fabricating the same.

In the semiconductor industry it is considered desirable to have a device with high integration, high speed, and low power consumption. One approach to realizing high integration, high speed, and a lower power consumption is a semiconductor device that utilizes a Silicon On Insulator (SOI) substrate rather than a substrate made of bulk silicon (hereinafter, a semiconductor device utilizing a SOI substrate is referred to as an "SOI device"). The advantages of an SOI device over a device formed with a substrate made of bulk silicon include: high speed due to low junction capacitance, low power consumption due to a low threshold voltage, and removal of latch-up due to complete isolation.

The SOI device is formed on a SOI substrate made of the following: a silicon substrate that supports the entire device, a silicon layer on which a gate is formed, and a filled oxide layer formed between the silicon substrate and the silicon layer. The gate is formed on the SOI substrate and a junction region is formed at both sides of the gate within the silicon layer.

This SOI device increases the effective channel length of the transistor, and thus can improve a short channel effect and can also minimize Drain Induced Barrier Lowering (DIBL) or a phenomenon in which interference between a source region and a drain region occurs. In addition, the SOI device can obtain a floating body effect since the body portion is isolated by the junction region and the buried oxide layer; and therefore, the floating body can store charges. Accordingly, a separate capacitor for storing charges is not needed, and the cell size can be reduced to $6F^2$ and $4F^2$.

However, in a conventional SOI device, although the junction region is formed at both sides of the gate within the surface of the silicon layer, the lower end of the junction region does not adjoin the buried oxide layer. Therefore, since the channel region i.e. the body of the transistor cannot be isolated by the junction region and the buried oxide layer, the floating body effect cannot be obtained.

It is possible to solve the aforementioned problem by carrying out an ion implantation process for forming the junction region at a dose that is high enough to make the lower end portion of the junction region fully adjoin the portion of the buried oxide layer therebelow. However, in this case, the distance between adjacent junction regions is decreased since when the junction region is formed it extends not only in a vertical direction but also in a horizontal direction within the silicon layer. As a consequence, punch-through may occur as the effective channel length of the transistor is reduced.

SUMMARY OF THE INVENTION

Embodiments of the present invention are directed to an SOI device that can obtain a floating body effect and a method for fabricating the same.

Also, embodiments of the present invention are directed to an SOI device that can prevent punch-through and a method for fabricating the same.

In one embodiment, an SOI device includes an SOI substrate having a structure in which a first buried oxide layer and a silicon layer are stacked in turn over a semiconductor substrate; a gate formed over the silicon layer of the SOI substrate; a second buried oxide layer formed at both sides of the gate in a lower portion of the silicon layer so that a lower end portion of the second buried oxide layer is in contact with the first buried oxide layer; and a junction region formed in the portion of the silicon layer above the second buried oxide layer so that a lower end portion of the junction region is in contact with the second buried oxide layer.

The second buried oxide layer may be formed as an $SiO_2$ layer.

In another embodiment, a method for fabricating a SOI device includes forming a gate over a silicon layer of a SOI substrate having a structure in which a first buried oxide layer and the silicon layer are stacked in turn over a semiconductor substrate; forming a second buried oxide layer at both sides of the gate in a lower portion of the silicon layer so that a lower end portion of the second buried oxide layer is in contact with the first buried oxide layer; and forming a junction region in the portion of the silicon layer above the second buried oxide layer so that a lower end portion of the junction region is in contact with the second buried oxide layer.

The second buried oxide layer may be formed as an $SiO_2$ layer.

The step of forming the second buried oxide layer comprises ion implanting impurities for promoting oxidation into the portion of the silicon layer at both sides of the gate; and heat treating the portion of the silicon layer into which the impurities are ion implanted so as to oxidate the portion.

The impurities for promoting oxidation include oxygen or fluorine.

The ion implantation may be carried out at a dose in the range of $1 \times 10^5 \sim 1 \times 10^{20}$ ions/cm$^2$.

The ion implantation may be carried out at an energy in the range of 1 KeV~1 MeV.

The heat treatment may be carried out in an atmosphere of $N_2$ and Ar gases at a temperature in the range of 500~1100° C.

The heat treatment may be carried out for a period of time in the range of 1~1800 seconds.

The junction region is formed by ion implanting impurities at an angle of incidence in the range of 1~15°.

In further another embodiment, a method for fabricating an SOI device includes forming a gate over a silicon layer of an SOI substrate having a structure in which a first buried oxide layer and the silicon layer are stacked in turn over a semiconductor substrate; forming a second buried oxide layer at both sides of the gate in a lower portion of the silicon layer so that a lower end portion of the second buried oxide layer is in contact with the first buried oxide layer; forming an insulation layer provided with a contact hole for a landing plug over the SOI substrate formed with the second buried oxide layer; forming a conductive layer doped with impurities over the insulation layer so as to bury the contact hole; and forming a junction region in the portion of the silicon layer above the second buried oxide layer so that a lower end portion of the junction region is in contact with the second buried oxide layer by diffusing the impurities doped in the conductive layer.

The second buried oxide layer may be formed as an $SiO_2$ layer.

The step of forming the second buried oxide layer includes ion implanting impurities for promoting oxidation into the portion of the silicon layer at both sides of the gate; and heat treating the portion of the silicon layer into which the impurities are ion implanted so as to oxidate the portion.

The impurities for promoting oxidation may include oxygen or fluorine.

The ion implantation may be carried out at a dose in the range of $1\times10^5 \sim 1\times10^{20}$ ions/cm$^2$.

The ion implantation is carried out at an energy in the range of 1 KeV~1 MeV.

The heat treatment is carried out in an atmosphere of $N_2$ and Ar gases at a temperature in the range of 500~1100° C.

The heat treatment is carried out for a period of time in the range of 1~1800 seconds.

The conductive layer includes a polysilicon layer having an impurities doping concentration in the range of $1\times10^{19} \sim 1\times10^{21}$ ions/cm$^3$.

DESCRIPTION OF SPECIFIC EMBODIMENTS

Hereinafter, preferred embodiments of the present invention will be described in detail with reference to accompanying drawings.

Figure 1:
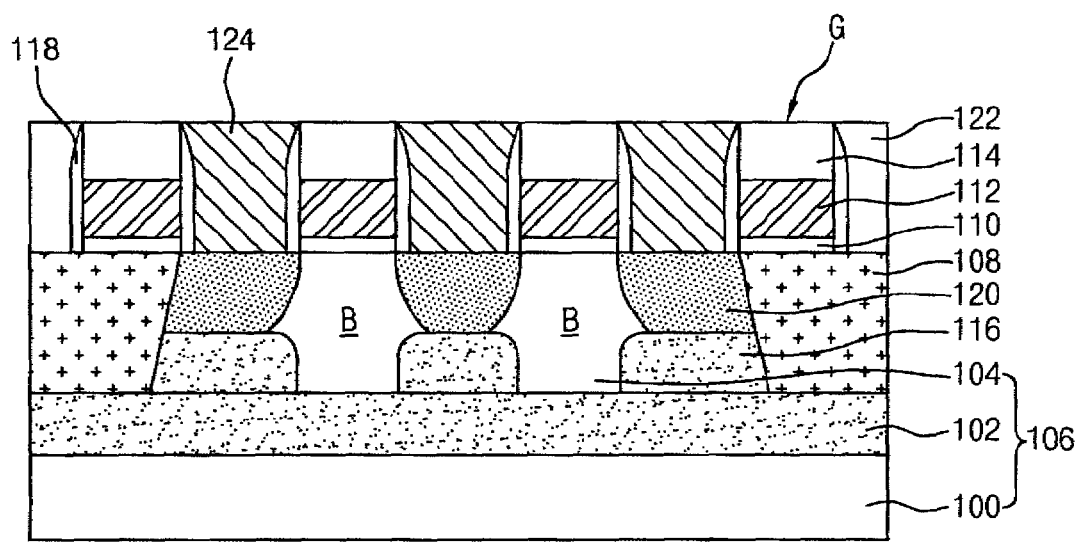
FIG. 1 is a cross-sectional view showing an SOI device in accordance with an embodiment of the present invention.

FIG. 1 is a cross-sectional view showing an SOI device in accordance with an embodiment of the present invention.

As shown, an SOI substrate 106 having a structure in which a first buried oxide layer 102 and a silicon layer 104 are stacked sequentially over a semiconductor substrate 100 is prepared, and an isolation layer 108 for defining an active region is formed within the silicon layer 104 of the SOI substrate 106. The isolation layer 108 is formed such that the lower end portion of the isolation layer 108 is in contact with the first buried oxide layer 102. A plurality of gates G are formed over the silicon layer 104 and the isolation layer 108 formed within the silicon layer 14. Each of the gates G includes a stacked structure of a gate insulation layer 110, a gate conductive layer 112 and a gate hard mask layer 114. Spacers 118 are formed on both side walls of each of the gates G.

A second buried oxide layer 116 is formed at both sides of a gate G formed on the silicon layer 104. The second buried oxide layer 116 is formed in a lower portion of the silicon layer 104 so that the lower end portion of the second buried oxide layer 116 is in contact with the first buried oxide layer 102. The second buried oxide layer 116 may include, for example, an SiO$_2$ layer. A junction region 120 is formed within a portion of the surface of the silicon layer 104 at both sides of the gate G, i.e. in the portion of the silicon layer 104 above the second buried oxide layers 116 at both sides of the gate so that the lower end portion of the junction region 120 is in contact with the second buried oxide layer 116. A landing plug 124 is formed over the junction region 120.

As described above, in an SOI device according to an embodiment of the present invention junction regions 120 are formed so that the lower end portion thereof is in contact with the second buried oxide layer 116. Therefore, a body B of the SOI device is isolated by the junction region 120 and the first and second buried oxide layer 104, 116, and thus the SOI device in accordance with an embodiment of the present invention has full floating body effect.

Also, the SOI device in accordance with an embodiment of the present invention can ensure an effective channel length, and thus the SOI device has improved punch-through properties since the distance between adjacent junction regions 120 is not reduced.

FIGS. 2A through 2F are cross-sectional views shown for illustrating the steps of a method for fabricating the SOI device in accordance with an embodiment of the present invention.

Figure 2A:
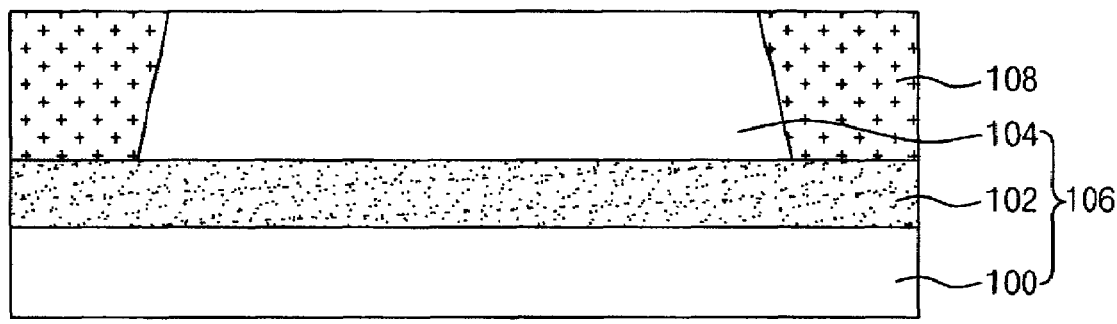
FIGS. 2A through 2F are cross-sectional views shown for illustrating the steps of a method for fabricating the SOI device in accordance with an embodiment of the present invention.

Referring to FIG. 2A, an SOI substrate 106 having a structure in which a first buried oxide layer 102 and a silicon layer 104 are sequentially stacked on a semiconductor substrate 100 is prepared. An isolation layer for defining an active region is formed within the silicon layer 104 of the SOI substrate 106, and an ion implantation process for forming a well is then performed. The isolation layer 108 is formed so that the lower end portion of the isolation layer 108 is in contact with the first buried oxide layer 102.

Figure 2B:
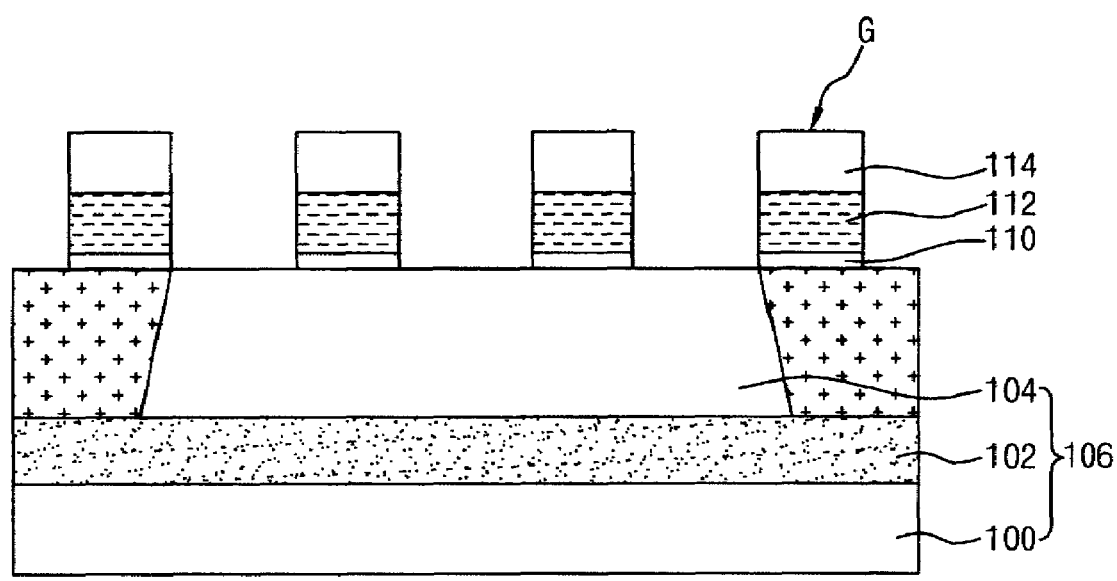

Referring to FIG. 2B, a gate insulation layer 110, a gate conductive layer 112 and a gate hard mask layer 114 are sequentially formed over the silicon layer 104 including the isolation layer 108. Thereafter, the gate hard mask layer 114, the gate conductive layer 112 and the gate insulation layer 110 are etched to form one or more gates G.

Figure 2C:
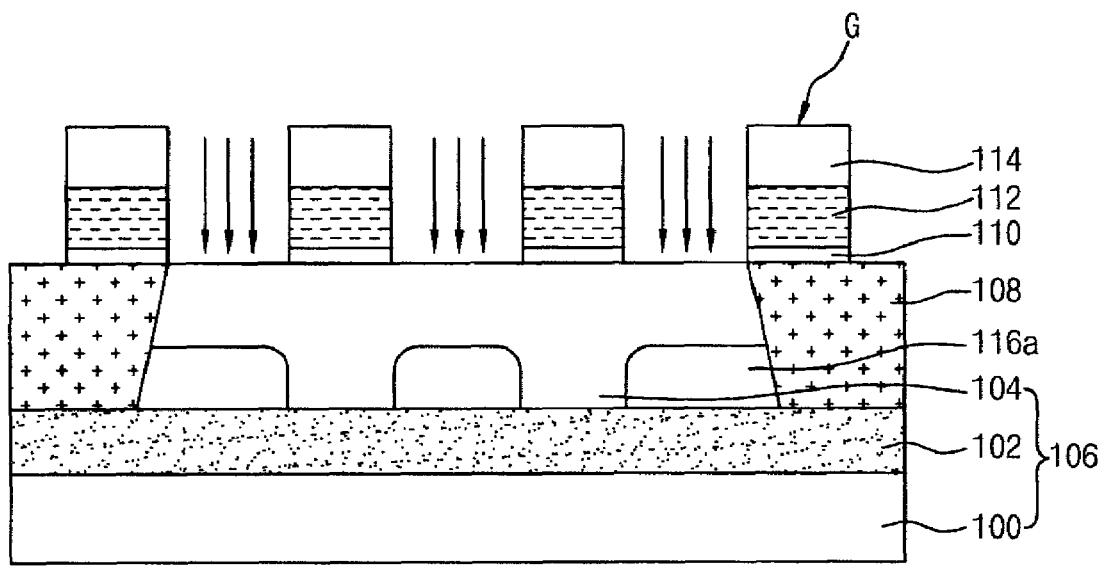

Referring to FIG. 2C, impurities for promoting oxidation are ion implanted into the lower portion of the silicon layer 104 at both sides of the gate G to form the ion implantation layer 116a. Oxygen (O$_2$) or fluorine (F) (preferably oxygen (O$_2$)) may be used as the impurities for promoting oxidation. The ion implantation of the impurities for promoting oxidation is carried out at a dose in the range of $1\times10^5 \sim 1\times10^{20}$ ions/cm$^2$, and preferably at a dose in the range of $1\times10^{14} \sim 1\times10^{16}$ ions/cm$^2$ and at an energy in the range of 1 KeV~1 MeV.

Figure 2D:
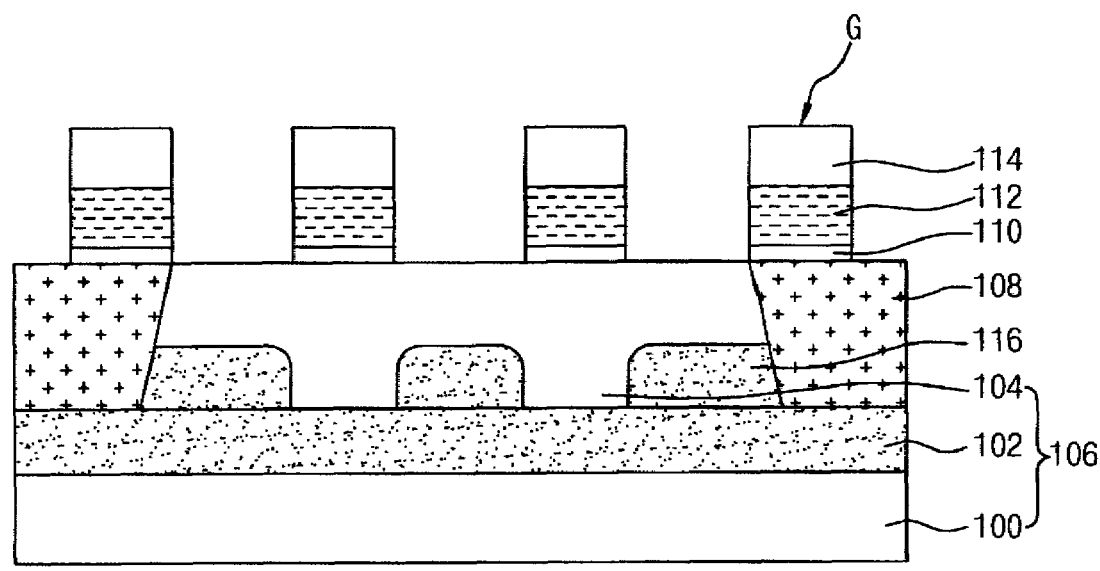

Referring to FIG. 2D, the resultant SOI substrate 106 (on which the ion implantation of the impurities for promoting oxidation has been carried out) is subject to a heat treatment. The heat treatment is carried out for a period of time in the range of 1~1800 seconds in an atmosphere of $N_2$ and Ar gases at a temperature in the range of 500~1100° C. As a result of the heat treatment, the ion implantation layer is oxidated and becomes an SiO$_2$ layer. Therethrough, the second buried oxide layer 116 is formed at both sides of the gate G in a lower portion of the silicon layer 104 such that a lower portion of the second buried oxide layer 116 is in contact with the first buried oxide layer 102. As a result of the heat treatment, a light oxide layer (not shown) may also be formed on the side wall of the gate conductive layer 112 of the gate 20G.

Figure 2E:
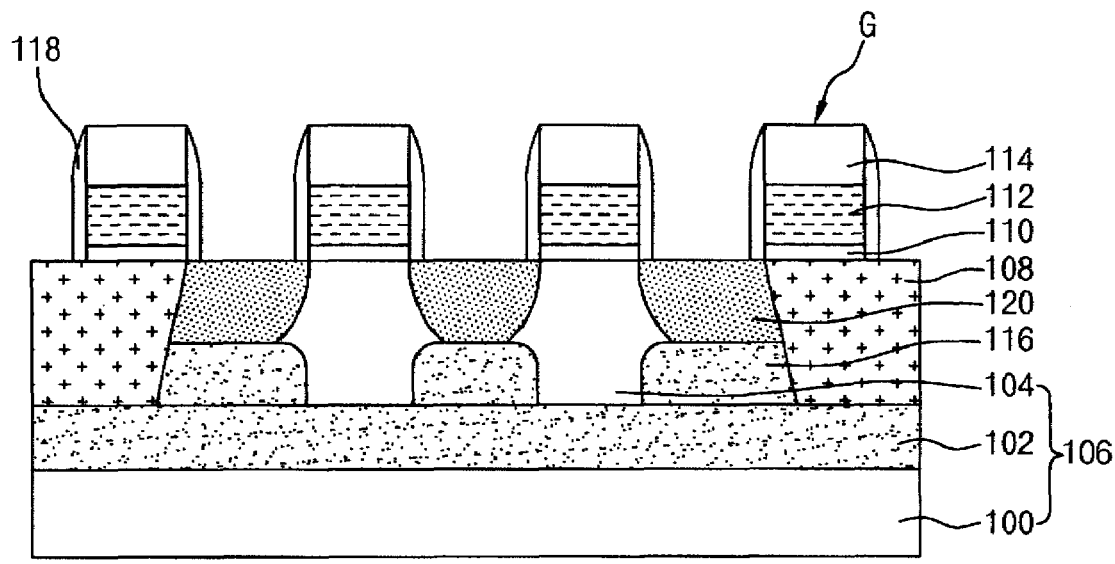

Referring to FIG. 2E, an insulation layer used for forming spacers is formed over the one or more gates G and the silicon layer 104. The silicon layer is then etched to form the spacers 118 on both side walls of each of the gates G. Impurities, e.g. N-type impurities, are ion implanted into the portion of the silicon layer 104 at both sides of the gate G and the spacers 118. Thereby, the junction region 120 is formed in the portion of the silicon layer 104 above the second buried oxide layer 116 such that the lower portion of the junction region 120 is in contact with the second buried oxide layer 116.

When ion implanting the N-type impurities, As or P, for example, is used as the N-type impurities. The ion implantation may be carried out at a dose in the range of $1\times10^5 \sim 1\times10^{20}$ ions/cm$^2$ and at an energy in the range of 1 KeV~1 MeV. Also, the ion implantation of the N-type impurities is carried out at an angle of incidence in the range of 1~15°.

Figure 2F:
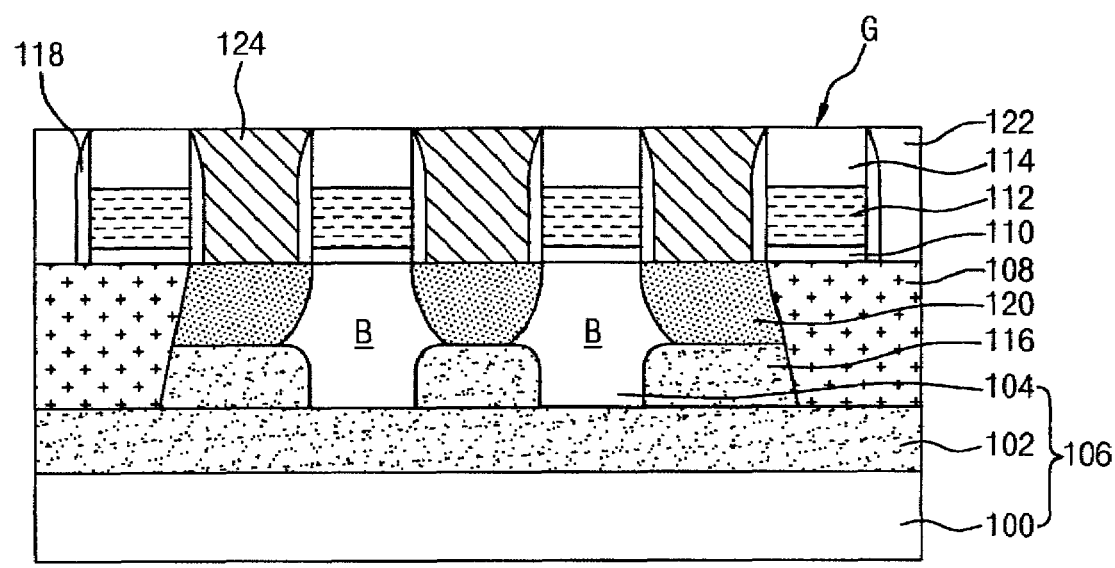

Referring to FIG. 2F, an insulation layer 122 is formed over the surface of the SOI substrate 106 including the junction region 120. The insulation layer 122 is etched to form one or more contact holes for landing plugs. That is, the insulation layer 122 is etched to expose the one or more junction regions 120 between any two gates G, and the landing plugs are to be formed within the etched portion of the insulation layer 122. Thereafter, a conductive layer, e.g. a polysilicon layer is filled in the contact holes for landing plugs in order to form the landing plugs 124 shown in FIG. 2F.

Thereafter, though not shown, a series of known follow up processes are sequentially performed, thereby completing the SOI device in accordance with an embodiment of the present invention.

As described above, in the present invention, second buried oxide layers 116 are formed at both sides of the gate G in a lower portion of the silicon layer 104 in addition to the ion implantation for forming junction regions 120, and the second buried oxide layers 116 are formed such that the lower portion of the second buried oxide layer 116 is in contact with the first buried oxide layer 102. The junction region 120 is formed in the portion of the silicon layer 104 above the second buried oxide layer 116 such that the lower portion of the junction region 120 is in contact with the second buried oxide layer 116. Therefore, the body B is isolated by the junction region 120 and the first and second buried oxide layer 104, 116 as well as the isolation layer 108. As a result, the present invention can stably obtain a floating body effect.

Also, in the present invention, the junction region 120 can be formed without a reduction in the distance between adjacent junction regions 120, i.e. a reduction in the channel region, and thus the effective channel length can be ensured. As a result, the present invention can prevent the punch-through phenomenon.

While the junction region is formed through ion implantation of N-type impurities in an embodiment of the present invention, the junction region may also be formed in such a manner that doped impurities are diffused into the polysilicon layer for the landing plug.

FIGS. 3A through 3D are cross-sectional views shown for illustrating the steps of a method for fabricating the SOI device in accordance with another embodiment of the present invention.

Figure 3A:
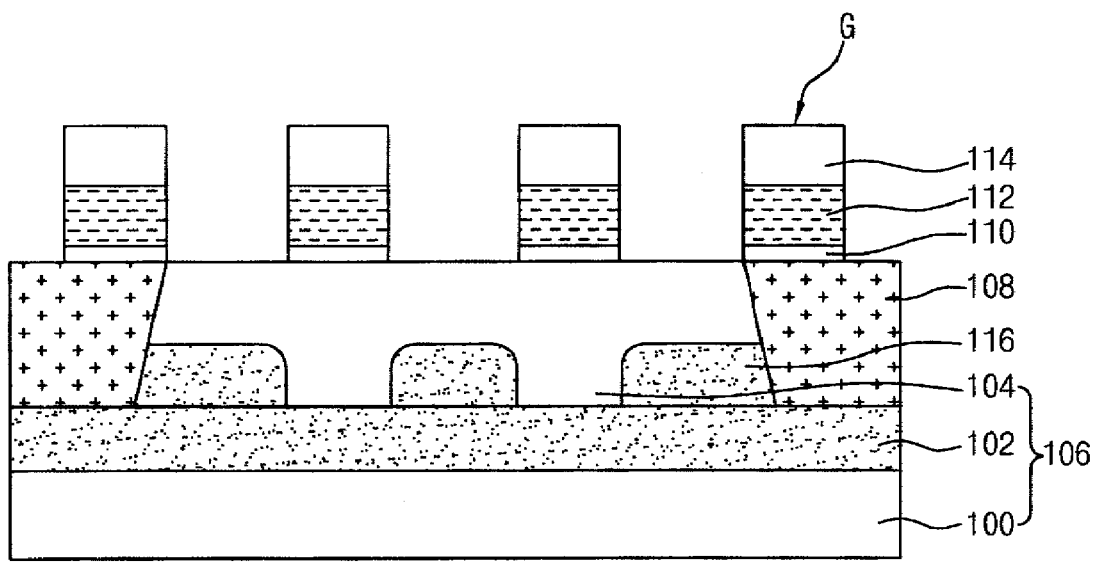
FIGS. 3A through 3D are cross-sectional views shown for illustrating the steps of a method for fabricating the SOI device in accordance with another embodiment of the present invention.

Referring to FIG. 3A, the second buried oxide layer 116 is formed at both sides of the gate G in a lower portion of the silicon layer 104 by the same manner as the embodiment of the present invention described above with reference to FIGS. 2A to 2F. The second buried oxide layer 116 is formed, for example, as an $SiO_2$ layer and is also formed so that the lower portion of the second buried oxide layer 116 is in contact with the first buried oxide layer 102.

Figure 3B:
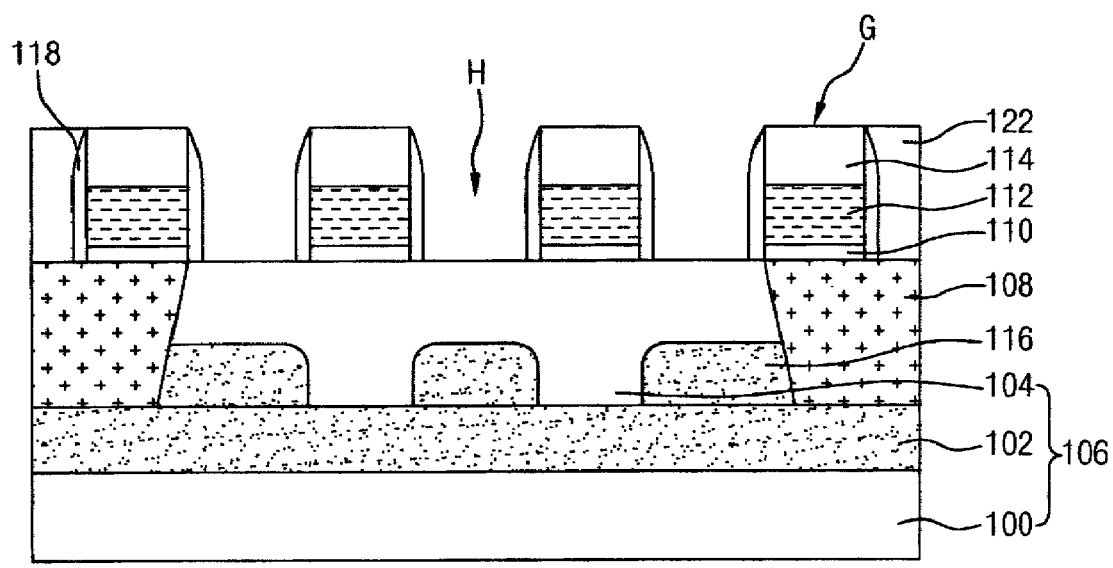

Referring to FIG. 3B, the insulation layer 122 is formed over the SOI substrate 106 formed with the second buried oxide layer 116 so as to cover the gate G. The insulation layer 122 is then chemically mechanically polished (CMPed) or etched back so that the gate hard mask layer 114 of the gate G is exposed. Thereafter, the insulation layer 122 is etched to form one or more contact holes H for the landing plug. The contact holes expose the junction regions 120 between any two of the gates G.

Figure 3C:
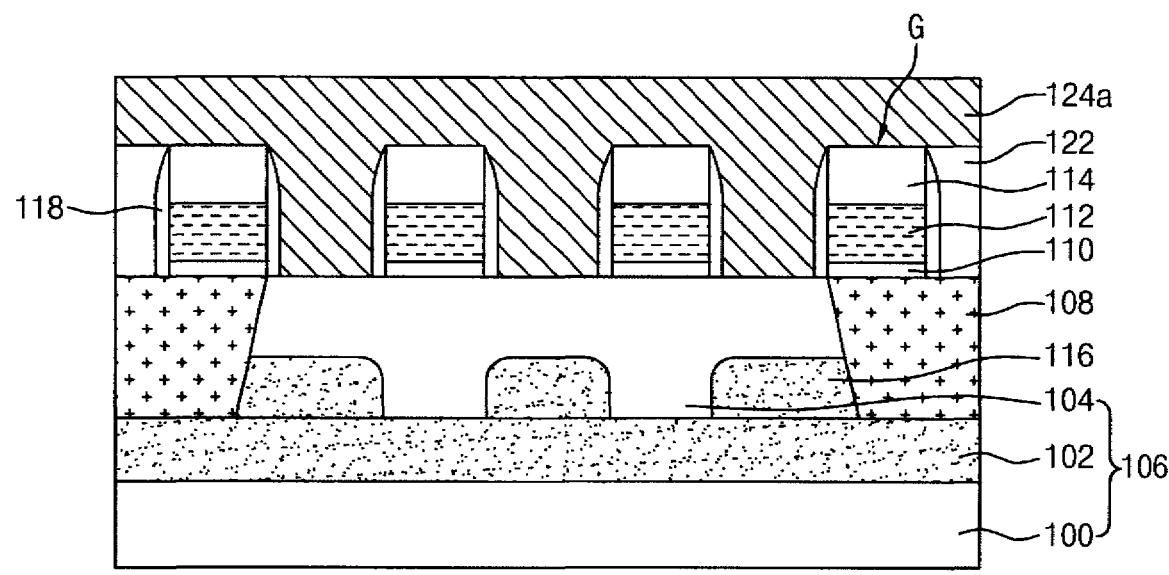

Referring to FIG. 3C, a conductive layer 124a for the landing plug is formed so as to bury the contact holes H for the landing plugs. The conductive layer 124a for the landing plug is formed, for example, as a polysilicon layer doped with N-type impurities. Preferably, the conductive layer 124a for the landing plug is formed as a polysilicon layer having a concentration in the range of $1 \times 10^{19}$~$1 \times 10^{21}$ ions/cm$^3$.

Figure 3D:
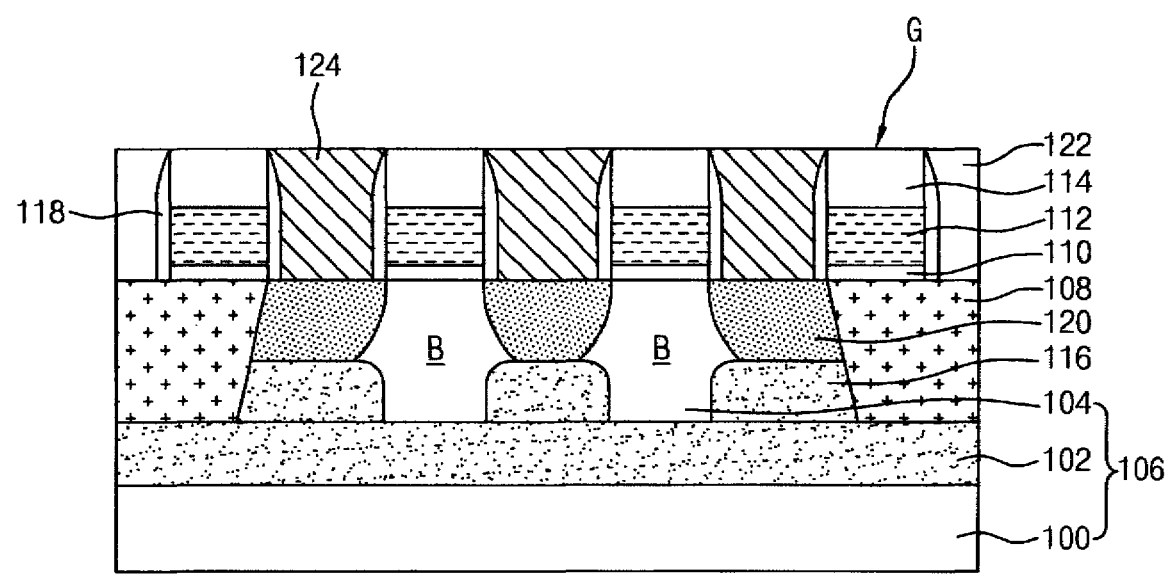

Referring to FIG. 3D, the conductive layer 124a for the landing plug is CMPed or etched back until the insulation layer 122 is exposed, through which one or more of the landing plugs 124 are formed in the space between gates G. The resultant SOI substrate 106 formed with the landing plugs 124 is subject to a heat treatment. As the result of the heat treatment, the N-type impurities doped in the landing plug 124 are diffused into the portion of the silicon layer 104 below the landing plug 124, and thus the junction regions 120 are formed in the portion of the silicon layer 104 at both sides of the gates G. At this time, the junction region 120 is formed in the portion of the silicon layer 104 above the second buried oxide layer 116 so that the lower end portion of the junction region 120 is in contact with the second buried oxide layer 116.

In another embodiment of the present invention, the CMP or etch-back of the conductive layer for the landing plug may be carried out after the heat treatment.

After that, though not shown, a series of known follow up processes are sequentially performed, thereby completing the SOI device in accordance with an embodiment of the present invention.

The method for fabricating the SOI device in accordance with the embodiment of the present invention shown in FIGS. 3A to 3d can, like an embodiment of the present invention described above, obtain the full floating body effect as well as prevent the punch-through. Also, the method for fabricating the SOI device in accordance with the embodiment of the present invention shown in FIGS. 3A to 3D employs a process in which impurities are diffused within the landing plug instead of an ion implantation process in order to form the junction region, and thus can prevent ion implantation damage caused on the SOI substrate during the ion implantation process.

While the spacer is described above as being formed after the second buried oxide layer is formed, in an embodiment of the present invention it is also possible to form the spacer first and then carry out the ion implantation of the impurities for promoting oxidation and the heat treatment to form the second buried oxide layer. In this case, the size of the body portion isolated by the junction region and the first and second buried oxide layers is increased, and thus the body portion can store more charge. Therefore, the cell size can be reduced further.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for fabricating an SOI device having an SOI substrate including a first buried oxide layer and a silicon layer sequentially stacked on a semiconductor substrate, the method comprising the steps of:

forming a gate over the silicon layer of the SOI substrate;

after forming the gate, forming a second buried oxide layer in a lower portion of the silicon layer at least one side of the gate, wherein the second buried oxide layer is formed such that a lower portion of the second buried oxide layer is in contact with the first buried oxide layer; and forming a junction region in the silicon layer above the second buried oxide layer such that a lower portion of the junction region is in contact with the second buried oxide layer.

2. The method according to claim 1, wherein the second buried oxide layer is formed to comprise an $SiO_2$ layer.

3. The method according to claim 1, wherein the step of forming the second buried oxide layer comprises the steps of:
ion implanting impurities for promoting oxidation into the portion of the silicon layer at least one side of the gate; and
heat treating the portion of the silicon layer into which the impurities are ion implanted to oxidate the portion.

4. The method according to claim 3, wherein the impurities for promoting oxidation comprise oxygen or fluorine.

5. The method according to claim 3, wherein the ion implantation is carried out at a dose in the range of $1\times10^5 \sim 1\times10^{20}$ ions/cm$^2$.

6. The method according to claim 3, wherein the ion implantation is carried out at an energy in the range of 1 KeV~1 MeV.

7. The method according to claim 3, wherein the heat treatment is carried out in an atmosphere comprising $N_2$ and Ar gases at a temperature in the range of 500~1100° C.

8. The method according to claim 3, wherein the heat treatment is carried out for a period of time in the range of 1~1800 seconds.

9. The method according to claim 1, wherein the junction region is formed by ion implanting impurities at an angle of incidence in the range of 1~15°.

10. A method for fabricating a SOI device having an SOI substrate including a first buried oxide layer and a silicon layer sequentially stacked on a semiconductor substrate, the method comprising the steps of:
forming a gate over the silicon layer of the SOI substrate;
after forming the gate, forming a second buried oxide layer in a lower portion of the silicon layer at least one side of the gate, wherein the second buried oxide layer is formed such that a lower portion of the second buried oxide layer is in contact with the first buried oxide layer;
forming an insulation layer having a contact hole over the SOI substrate;
forming a conductive layer doped with impurities over the insulation layer and within the contact hole; and
forming a junction region in the silicon layer above the second buried oxide layer such that a lower portion of the junction region is in contact with the second buried oxide layer by diffusion of the impurities doped in the conductive layer.

11. The method according to claim 10, wherein the second buried oxide layer is formed to comprise an $SiO_2$ layer.

12. The method according to claim 10, wherein the step of forming the second buried oxide layer comprises the steps of:
ion implanting impurities for promoting oxidation into the portion of the silicon layer at least one side of the gate; and
heat treating the portion of the silicon layer into which the impurities are ion implanted to oxidate the portion.

13. The method according to claim 12, wherein the impurities for promoting oxidation comprise oxygen or fluorine.

14. The method according to claim 12, wherein the ion implantation is carried out at a dose in the range of $1\times10^5 \sim 1\times10^{20}$ ions/cm$^2$ and at an energy in the range of 1 KeV~1 MeV.

15. The method according to claim 12, wherein the heat treatment is carried out in an atmosphere comprising $N_2$ and Ar gases at a temperature in the range of 500~1100° C.

16. The method according to claim 12, wherein the heat treatment is carried out for a period of time in the range of 1~1800 seconds.

17. The method according to claim 10, wherein the conductive layer includes a polysilicon layer having an impurities doping concentration in the range of $1\times10^{19} \sim 1\times10^{21}$ ions/cm$^3$.

18. The method according to claim 10, wherein the step of forming the junction region comprises the step of heat treating the semiconductor substrate formed with the conductive layer doped with impurities such that the impurities of the conductive layer diffuse into the silicon layer.

* * * * *